(12) United States Patent
Sutton

(10) Patent No.: US 7,005,927 B2
(45) Date of Patent: Feb. 28, 2006

(54) LOW NOISE YIG OSCILLATOR BASED PHASE LOCKED LOOP

(75) Inventor: Brian P. Sutton, West Linn, OR (US)

(73) Assignee: Tektronix, Inc., Beaverton, OR (US)

( * ) Notice: Subject to any disclaimer, the term of this patent is extended or adjusted under 35 U.S.C. 154(b) by 63 days.

(21) Appl. No.: 10/857,199

(22) Filed: May 28, 2004

(65) Prior Publication Data

US 2005/0275479 A1   Dec. 15, 2005

(51) Int. Cl.
*H03L 7/00* (2006.01)
*H03L 7/099* (2006.01)

(52) U.S. Cl. .............................. 331/10; 331/11; 331/25

(58) Field of Classification Search ................ 331/1 A, 331/10–12, 16–18, 25
See application file for complete search history.

(56) References Cited

U.S. PATENT DOCUMENTS 6,188,349 B1 *   2/2001   Spencer et al. ............... 342/62

* cited by examiner

*Primary Examiner*—David Mis
(74) *Attorney, Agent, or Firm*—Francis I. Gray

(57) ABSTRACT

A low phase noise YIG oscillator based phase locked loop couples an output frequency to a delay line discriminator to provide a phase noise feedback signal to a wideband tuning port of the YIG oscillator. A delay line in the delay line oscillator may be implemented with either a resonant circuit or a bandpass filter of sufficient bandwidth so that the output frequency and phase noise sidebands are not attenuated. The resonant circuit may be implemented as a YIG sphere integrated into the YIG oscillator in the same magnetic path as the YIG sphere in the oscillator circuitry.

4 Claims, 2 Drawing Sheets

LOW NOISE YIG OSCILLATOR BASED PHASE LOCKED LOOP

BACKGROUND OF THE INVENTION

The present invention relates to phase locked loops, and more particularly to a low noise Yttrium-Iron-Garnet (YIG) oscillator based phase locked loop for radio frequency (RF) applications.

In its simplest form a microwave or RF signal source has a phase locked loop (PLL) using a YIG oscillator. The YIG oscillator, which is central to the design, is an electronic device that generates an output signal with a frequency proportional to the strength of a magnetic field impressed upon a YIG sphere. The magnetic field is created by direct currents (DC) in the oscillator's main and fine tune coils which may be augmented in some cases by permanent magnets. Phase locking is achieved in the usual sense in that the output frequency of the YIG oscillator is divided down by a frequency divider and compared to a reference frequency applied at a phase detector. The phase detector generates a control voltage proportional to the phase difference between the two frequency signals applied at its input ports. This phase error voltage is filtered by a loop filter, converted to a DC current, and applied to the YIG oscillator fine tune coil to adjust its output frequency. When the PLL is "locked", the YIG oscillator's output frequency is "N times" the applied reference frequency, i.e., Fout=N*Fref.

In a typical PLL application the YIG oscillator is tuned approximately to a desired output operating frequency by establishing a fixed current in the main coil. Phase locking the YIG oscillator to the reference frequency is achieved by controlling the fine tune coil current with the filtered control current derived from the phase detector. YIG oscillators have the desirable attributes of wide tuning range on the order of several octaves, operation at microwave frequencies, linear tuning response with respect to the coil currents, and often good phase noise performance. One disadvantage of present YIG technology is that the modulation bandwidth of the fine tune coil is limited to less than 1 MHz. The modulation bandwidth of the main coil is considerably less due to its much larger inductance needed to achieve its larger tuning range. As a consequence of requiring good loop stability in the PLL feedback control system, the loop bandwidth of the PLL must be less than the modulation bandwidth of the fine tune coil—usually limited to several hundred kHz.

Within the loop bandwidth the PLL can suppress the YIG oscillator's phase noise, but outside the loop bandwidth the phase noise levels are predominantly determined by the performance of the YIG oscillator. The limited modulation bandwidth of the fine tune coil, and resultant inability of the PLL to suppress the YIG oscillator's phase noise beyond approximately several hundred kHz from an RF carrier, is a limitation of the present technology. In applications where extremely low phase noise is required at offsets up to and beyond several MHz from the carrier, the YIG oscillator is extremely difficult and expensive, or even impossible, to manufacture. Such a problem occurs when measuring the Adjacent Channel Leakage Ratio (ACLR) of modern communications systems. Test equipment capable of measuring ACLR to better than −75 dB require internal oscillators with phase noise levels of −165 dBc/Hz at offset frequencies of 5 MHz and greater from the carrier. This is beyond the performance level presently achievable with conventional YIG oscillators and PLL techniques.

What is desired is a low noise YIG oscillator based PLL that provides the requisite low phase noise levels required for measurements in modern communications systems.

BRIEF SUMMARY OF THE INVENTION

Accordingly the present invention provides a low noise YIG oscillator based PLL that couples an output frequency from the PLL to a delay line discriminator to provide a phase noise feedback signal to a wideband tuning port of the YIG oscillator. A delay line in the delay line oscillator may be implemented with either a resonant circuit or a bandpass filter of sufficient bandwidth so that the output frequency and phase noise sidebands are not attenuated. The resonant circuit may be implemented as a YIG sphere integrated into the YIG oscillator in the same magnetic path as the YIG sphere in the oscillator circuitry.

The objects, advantages and other novel features of the present invention are apparent from the following detailed description when read in conjunction with the appended claims and attached drawing.

DETAILED DESCRIPTION OF THE INVENTION

Figure 1:
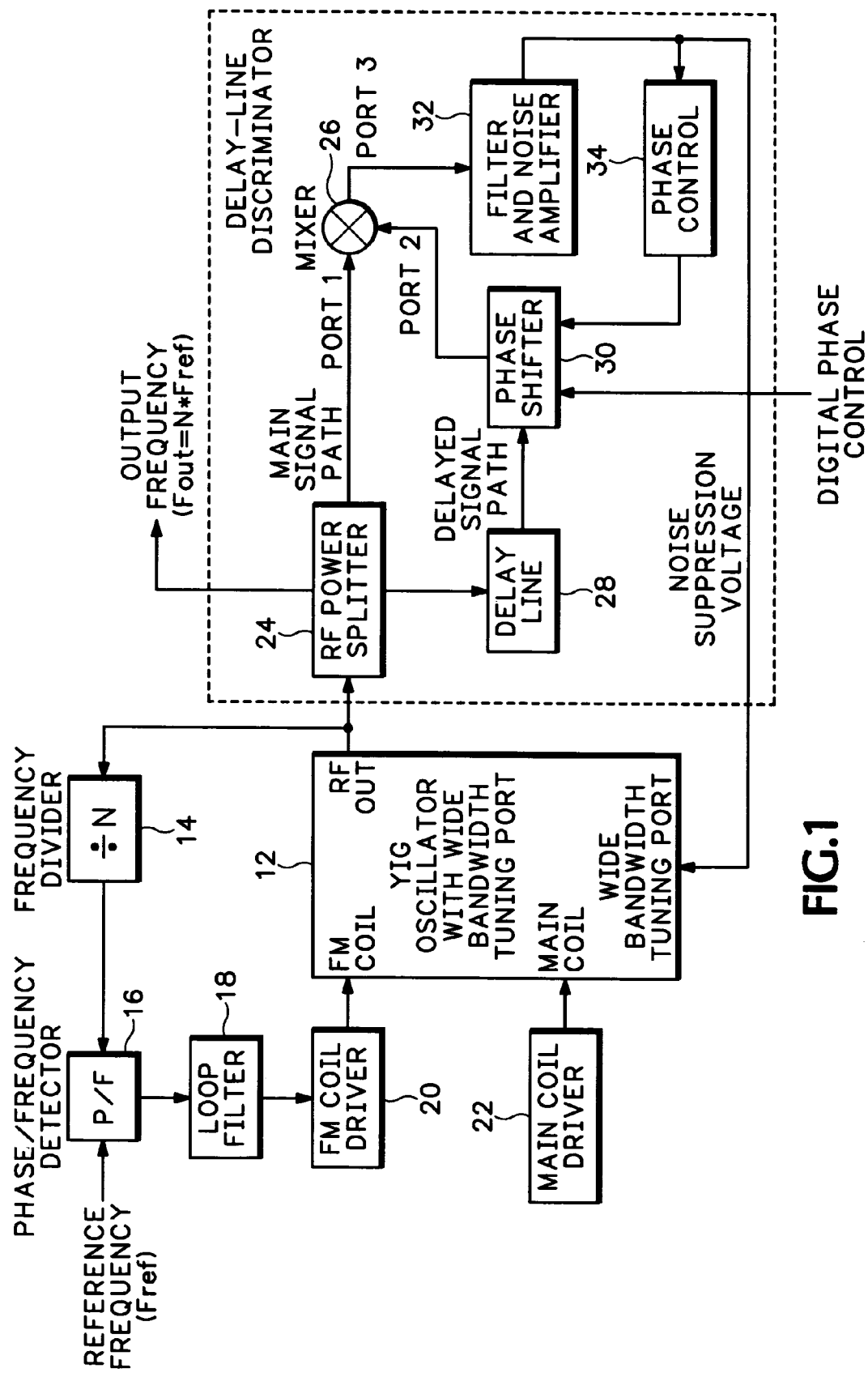
FIG. 1 is a block diagram view of a low noise YIG oscillator based PLL according to the present invention.

Referring now to FIG. 1 a wide bandwidth YIG oscillator 12 is shown having a main coil input, a fine tune (FM) coil input and an RF output. Added to the conventional YIG oscillator 12 is a wide bandwidth tuning port. The RF output is coupled to a frequency divider 14, the output of which in turn is coupled to one input port of a phase detector 16. The other input of the phase detector 16 is a reference frequency. The phase error output from the phase detector 16 is filtered by loop filter 18 to provide a control voltage to an FM coil driver 20. The FM coil driver 20 provides a DC current to the FM coil input of the YIG oscillator 12. A fixed main coil driver 22 provides a DC current to the main coil input of the YIG oscillator 12. So far what is described is a conventional YIG oscillator PLL.

The RF output from the YIG oscillator 12 is coupled to an RF power splitter 24 that provides three outputs, one of which is the desired output frequency, Fout. The other two outputs from the RF power splitter 24 are input respectively to a main signal path and a delayed signal path. The main signal path includes a mixer 26 having one input coupled to the main signal path output from the RF power splitter 24 and another input coupled to the output from the delayed signal path. The delayed signal path includes a delay line 28 coupled to the delay signal path output from the RF power splitter 24 which is in series with a phase shifter 30. The output of the phase shifter 30 is the delay signal path output coupled to the mixer 26. The output from the mixer 26 is coupled to filter and noise amplifier circuit 32, the output of which is coupled as a noise suppression voltage to the wide bandwidth tuning port of the YIG oscillator 12 and to the input of a phase control circuit 34. The output from the phase control circuit 34 is applied as a control signal for the phase shifter 30 to which also is applied a digital phase control signal. This added circuitry acts as a delay line discriminator (DLD) to measure the phase noise at the output of the PLL, i.e., the RF output from the YIG oscillator 12, and uses negative feedback to the YIG oscillator to suppress its noise.

Unlike prior applications of the DLD technique to reduce PLL phase noise, the present invention does not use the narrow band FM tuning coil in the noise suppression mechanism. The present YIG oscillator 12 has been modified to incorporate the wide bandwidth tuning port, which may be achieved using varactor diodes. The added wide bandwidth tuning port need not have a large tuning range for this application. The important requirement is that the wide bandwidth tuning port have a sufficiently wide modulation bandwidth to allow the phase noise measured by the DLD circuitry to be fed back into the YIG oscillator 12 to cancel the PLL noise. Although this modification may increase the intrinsic noise of the YIG oscillator 12, the overall noise level of the PLL system is improved by the combined noise suppression mechanisms of the PLL loop bandwidth and the DLD circuitry. The PLL's loop bandwidth still suppresses the YIG oscillator's noise up to offset frequencies limited by the modulation bandwidth of the FM coil. Beyond the PLL's loop bandwidth the oscillator's phase noise is suppressed by the operation of the DLD and the oscillator's wide bandwidth tuning port.

The phase of the two inputs to the mixer 26 is adjusted so that the two signals are 90 degrees apart at the respective input ports and the mixer operates as a phase detector, i.e., the output from the mixer is a voltage proportional to the difference in phase between the two input signals. An RF output signal equal to the sum of the applied signal frequencies also appears t the output of the mixer—two-times the PLL output frequency, but it is not useful to the circuit's operation and is removed by the filter and noise amplifier circuit 32. When the two input signals to the mixer 26 are orthogonal, the DC output of the mixer is zero volts DC and the mixer has its greatest phase sensitivity to phase differences in the input signals. Any phase noise on the PLL output which represents phase modulation on the output frequency signal results in a corresponding baseband noise voltage appearing at the output of the mixer 26. This noise voltage may extend from DC to tens of MHz in bandwidth, and represents the actual phase noise of the PLL. By properly filtering, amplifying and feeding back this noise signal to the YIG oscillator 12 via the wide bandwidth tuning port, the phase noise of the PLL is reduced.

The DLD detection sensitivity is proportional to the amount of delay in the delay line. Noise detection and suppression at several MHz off the carrier may be achieved with modest amounts of delay. For example a delay of 100 ns is suitable for noise detection and suppression at offsets of 1 MHz and greater. At lower offset frequencies the sensitivity of the DLD circuitry to noise diminishes. This generally is not a problem because noise close-in to the carrier is within the PLL loop bandwidth and is suppressed by the PLL intrinsic closed-loop behavior. The DLD circuitry and YIG oscillator wide modulation bandwidth is responsible for reducing the phase noise at frequency offsets greater than the PLL loop bandwidth.

The phase control circuit 34 monitors the DC voltage level at the output of the mixer 26 and applies a DC correction voltage to the phase shifter 30 to maintain the average phase difference of the mixer's two input signals at quadrature. The phase shifter 30 may also incorporate numerous fixed phase steps that are switched under control of the digital phase control signal to provide a large phase shift adjustment range. This minimizes the range of the analog continuous phase control adjustment needed by the phase shifter 30.

Figure 2:
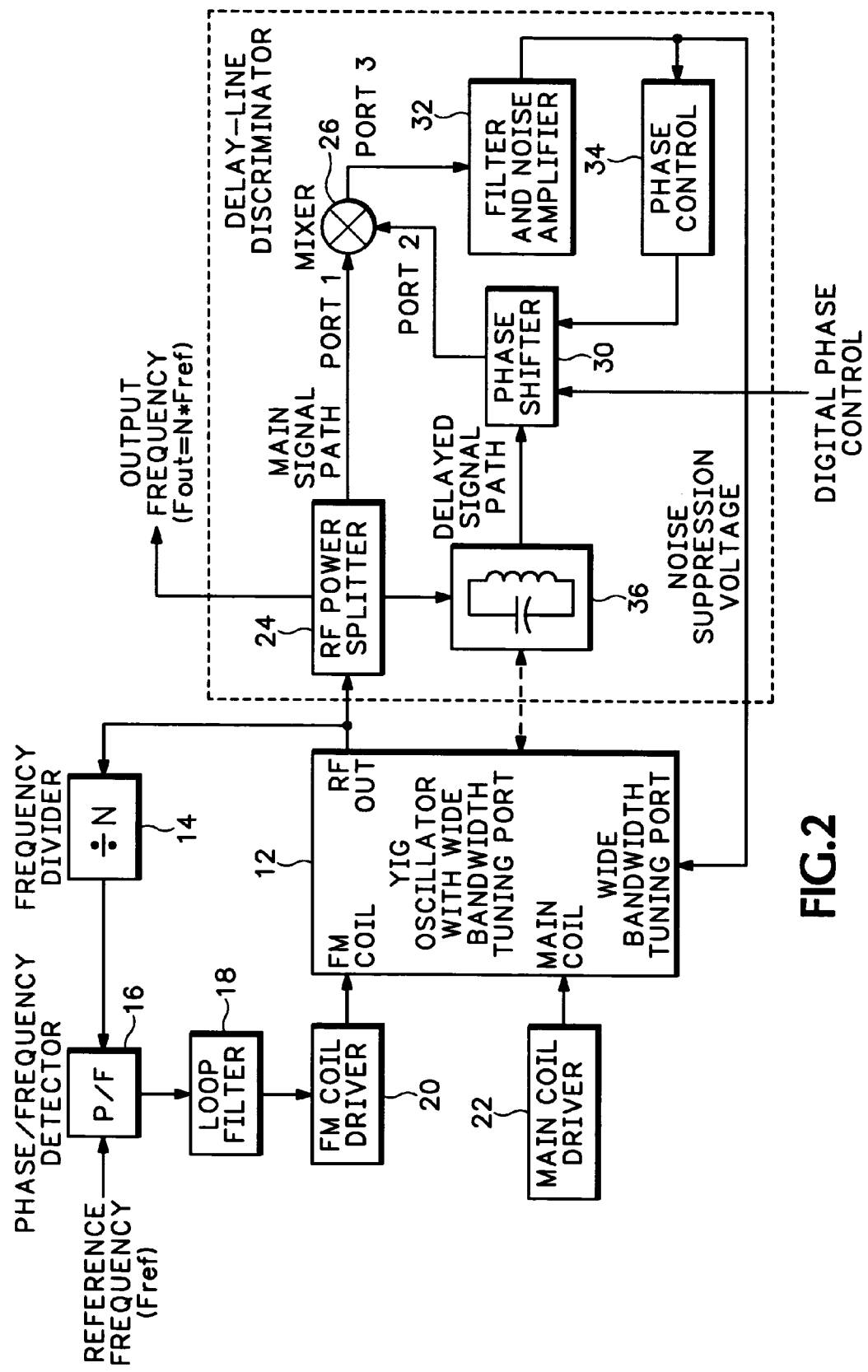
FIG. 2 is a block diagram view of an alternate embodiment of a low noise YIG oscillator based PLL according to the present invention.

As a further improvement the delay line 28 may be replaced with a resonant circuit 36, as shown in FIG. 2. In this case the resonant circuit 36 may be integrated into the YIG oscillator 12 as a YIG sphere in the same magnetic path as the YIG sphere in the oscillator circuitry. As the oscillator is tuned, the resonant frequency of the YIG delay elements tunes with it to produce the desired delayed signal to the delay path port of the mixer 26. This approach has the added benefit that it results in a smaller physical implementation of the delay line. The YIG delay element may even be implemented as a bandpass filter of sufficient bandwidth so that the desired signals that are being delayed (PLL output plus phase noise sidebands) are not attenuated. The actual bandwidth is not critical—the only requirements being sufficient signal bandwidth and adequate delay. In addition the sensitivity and noise floor of the detector is likely to be improved using this approach, facilitating improved YIG oscillator phase noise suppression.

Thus the present invention provides a low noise YIG oscillator based phase locked loop by coupling the output of the YIG oscillator to a delay line discriminator circuit to provide a phase noise feedback signal to a wide bandwidth tuning port of the YIG oscillator.

What is claimed is:

1. An improved low noise YIG oscillator based phase locked loop of the type having a YIG oscillator that produces an output frequency, means for dividing the output frequency to provide a feedback frequency, means for comparing the feedback frequency with a reference frequency to generate a phase difference signal and means for filtering the phase difference signal to provide a control signal that is applied to a fine tune coil of the YIG oscillator to control the output frequency, the improvement comprising a delay line discriminator for obtaining a phase noise voltage from the output frequency, the phase noise voltage being applied to a wide bandwidth tuning port of the YIG oscillator as a negative feedback signal to suppress phase noise in the output frequency that is beyond the phase locked loop bandwidth.

2. The improved low noise YIG oscillator based phase locked loop as recited in claim 1 wherein a delay line in the delay line discriminator comprises a resonant circuit.

3. The improved low noise YIG oscillator based phase locked loop as recited in claim 2 wherein the resonant circuit comprises a YIG sphere integrated into the YIG oscillator in the same magnetic path as the YIG sphere in the oscillator circuitry.

4. The improved low noise YIG oscillator based phase locked loop as recited in claim 1 wherein a delay line in the delay line discriminator comprises a bandpass filter of sufficient bandwidth so that the output frequency and phase noise sidebands are not attenuated.

\* \* \* \* \*